United States Patent
Choi

(10) Patent No.: US 7,881,481 B2
(45) Date of Patent: Feb. 1, 2011

(54) AUDIO PROCESSING APPARATUS AND METHOD

(75) Inventor: Shin Kyo Choi, Gwachun-si (KR)

(73) Assignee: LG Electronics Inc., Seoul (KR)

( * ) Notice: Subject to any disclaimer, the term of this patent is extended or adjusted under 35 U.S.C. 154(b) by 1293 days.

(21) Appl. No.: 11/436,022

(22) Filed: May 18, 2006

(65) Prior Publication Data

US 2006/0263063 A1    Nov. 23, 2006

(30) Foreign Application Priority Data

May 18, 2005    (KR) ...................... 10-2005-0041438

(51) Int. Cl.
*H04B 15/00* (2006.01)
(52) U.S. Cl. ........................... 381/94.5; 84/612; 84/636
(58) Field of Classification Search ................ 381/94.4, 381/94.5, 94.8, 119; 330/254, 51, 270–271, 330/10, 207, 251; 700/94; 84/600, 603, 84/609, 612, 636
See application file for complete search history.

(56) References Cited

U.S. PATENT DOCUMENTS 3,360,610 A * 12/1967 Flanagan ................... 704/203
7,366,491 B1 * 4/2008 Suzuki et al. ............... 455/296
7,709,723 B2 * 5/2010 Pachet et al. ................. 84/603
2004/0196988 A1 * 10/2004 Moulios et al. ............. 381/119

* cited by examiner

*Primary Examiner*—Devona E Faulk
*Assistant Examiner*—Disler Paul
(74) *Attorney, Agent, or Firm*—Birch, Stewart, Kolasch & Birch, LLP

(57) ABSTRACT

Disclosed herein are an audio processing apparatus and method. In an embodiment, if a playing mode that abruptly changes the level of audio being played has been input, the data of the audio is processed to mitigate the abrupt change in the level of the audio and converted into analog signals, and the analog signals are output. In an embodiment, if a playing mode that causes a jump from the current track of the audio being played to another track is input, the audio data is divided by an exponential function of 2 before the jump to the another track is completed. In another embodiment, if a playing mode that rapidly moves a playing position to another location on the same track has been input, the audio data is divided by a specific exponential function, and is then multiplied by the exponential function after the playing mode has been completed.

18 Claims, 3 Drawing Sheets

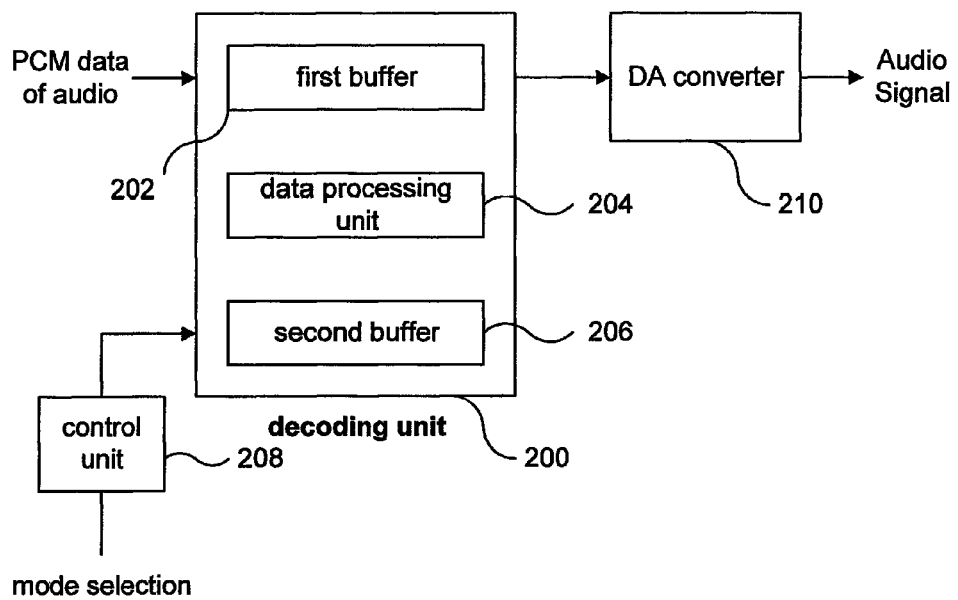

AUDIO PROCESSING APPARATUS AND METHOD

BACKGROUND OF THE INVENTION

1. Field of the Invention

The present invention relates generally to audio processing and, more particularly, to an apparatus and method for eliminating pop noises that are generated when playing conditions are changed during the playing of audio.

2. Description of the Related Art

FIG. 1 illustrates the construction of a circuit for eliminating pop noises in conventional audio equipment.

The pop noise elimination circuit, as illustrated in FIG. 1, includes a power signal unit 100 for detecting the application and cutoff of power Vcc and generating a noise elimination drive signal for a predetermined period, a switching signal unit 102 for outputting a noise elimination drive signal in response to a signal that is generated when a mode or source is switched, a pop noise elimination unit 104 for receiving the noise elimination drive signal from the power signal unit 100 or switching signal unit 102 and grounding the output terminal of an audio input unit 103, and the audio output unit 103 connected to an audio output device AO.

The power signal unit 100 includes a condenser C2 configured to receive power Vcc via a resistor R1 and be charged with the power Vcc, a diode D1 connected in parallel to the resistor R1 in the reverse direction, a condenser C3 configured to receive the power Vcc via a diode D2 and be charged with the power Vcc, a transistor TR1 configured such that the charge voltage of the condenser C2 is applied to the base thereof, the charge voltage of the condenser C3 is applied to the emitter thereof and, thus, a noise elimination drive signal is output via the collector thereof, a ground resistor R3 connected to the collector of the transistor TR1, and a diode D3 configured to output a signal from a node N3 of the collector of the transistor TR1 and the ground resistor R3. The resistance value of the resistor R1 is set well above the resistance value of the resistor R2.

The switching signal unit 102 is configured to receive a switching signal via a General Purpose Input/Output (GPIO) control terminal and output a noise elimination drive signal via a resistor R4 and a diode D4.

The audio output unit 103 is configured to output an audio signal, which is received from an audio signal input device AI, to the audio output device AO via a buffer B1 and a Direct Current (DC) coupling condenser C1.

The pop noise elimination unit 104 is formed of a transistor TR2 that receives a noise elimination drive signal from the power signal unit 100 and/or the switching signal unit 102 and grounds the output terminal of the audio output unit 103 connected to the input terminal of the audio output device AO.

The operation of the pop noise elimination circuit of FIG. 1 is described below.

When power Vcc is applied, the power Vcc charges the condenser C2 via the resistor R1, which has a high resistance value, so that the charge voltage of the node 1 N1 slowly increases. In contrast, the power Vcc charges the condenser C3 via the diode D2 and the resistor R2, which has a small resistance value, so that the charge voltage of node 2 N2 rapidly increases.

The transistor TR1 is electrically conductive for a predetermined period corresponding to a charge time-constant period, after which the charge voltage of the condenser C2 reaches a predetermined level, so that a noise elimination drive signal is output through the collector thereof to a node 3 N3. Since the noise elimination drive signal is applied to the base of the transistor TR2 and makes the transistor TR2 conductive, the audio output device AO is grounded via the transistor TR2, therefore pop noises generated while the power Vcc is applied are eliminated.

When the voltage of the condenser C2 reaches a predetermined level after a predetermined period, the transistor TR1 becomes closed, so that a low potential signal based on a ground potential is output from the node 3 N3, that is, the collector of the transistor TR1. Accordingly, the transistor TR2 is closed, so that audio signals from the audio input device AI are normally output to the audio output device AO.

Meanwhile, when the power Vcc is cut off, the charge voltage of the condenser C2 is rapidly discharged through the diode D1, and the node 1 N1 enters a low state. Since the voltage of the condenser C3 is not discharged by the diode D2 connected in the reverse direction, the transistor TR1 becomes conductive.

As a result, the charge voltage of the condenser C3 is discharged through the transistor TR1 and the resistor R3, so that a high potential signal, that is, a noise elimination drive signal, is output from the node 3 N3 for a predetermined period corresponding to a discharge time-constant period, and the high-potential noise elimination drive signal makes the transistor TR2 conductive through the diode D3, therefore pop noises generated while the power Vcc is cut off are eliminated.

Meanwhile, when a mode or source is switched, high-potential switching signal is applied for a predetermined period via the switching signal input terminal of the switching signal unit 102.

The node 4 N4 is at a high state for the predetermined period and the transistor TR2 becomes conductive, so that the audio output device AO is grounded for the predetermined period, therefore pop noises generated while a mode or source is switched are eliminated.

The conventional pop noise elimination apparatus has both the problem of having a large system size, and the problem of the degradation of trustworthiness of a digital amplifier due to the repetition of high-speed switching.

SUMMARY OF THE INVENTION

Accordingly, the present invention has been made keeping in mind the above problems occurring in the prior art, and an object of the present invention is to provide an apparatus and method for efficiently eliminating pop noises.

In order to accomplish the above object, the present invention provides an audio processing method, including the steps of determining whether a playing mode that abruptly changes the level of audio being played has been input; and processing data of the audio so as to mitigate the abrupt change in the level of the audio if the playing mode has been input.

In order to accomplish the above object, the present invention provides an audio processing apparatus, including a signal processing unit for performing signal processing on audio data; a digital-analog converter for converting the processed audio data into analog signals and outputting the analog signals; and a control unit for determining whether a playing mode that abruptly changes the level of audio being played has been input, and controlling the signal processing unit so as to mitigate the abrupt change in the level of the audio if the playing mode has been input.

Preferably, the playing mode may be a track skip mode or an audio file change mode that causes a jump from a current track of the audio being played to another track, and the audio data may be divided by a specific exponential function before the jump to the another track is completed.

Preferably, the playing mode may be a playing mode that rapidly moves a playing position to another location on the same track, and the audio data may be divided by an exponential function of 4, and may be multiplied by the exponential function of 4 after the playing mode has been completed.

BRIEF DESCRIPTION OF THE DRAWINGS

The above and other objects, features and advantages of the present invention will be more clearly understood from the following detailed description taken in conjunction with the accompanying drawings, in which:

FIG. 2 is a block diagram illustrating an apparatus for eliminating pop noises according to an embodiment of the present invention;

FIG. 3 illustrates an embodiment of the present invention in which the PCM data of audio is differently processed according to the selected playing mode so as to eliminate pop noises.

DETAILED DESCRIPTION OF PREFERRED EMBODIMENTS

Figure 1:
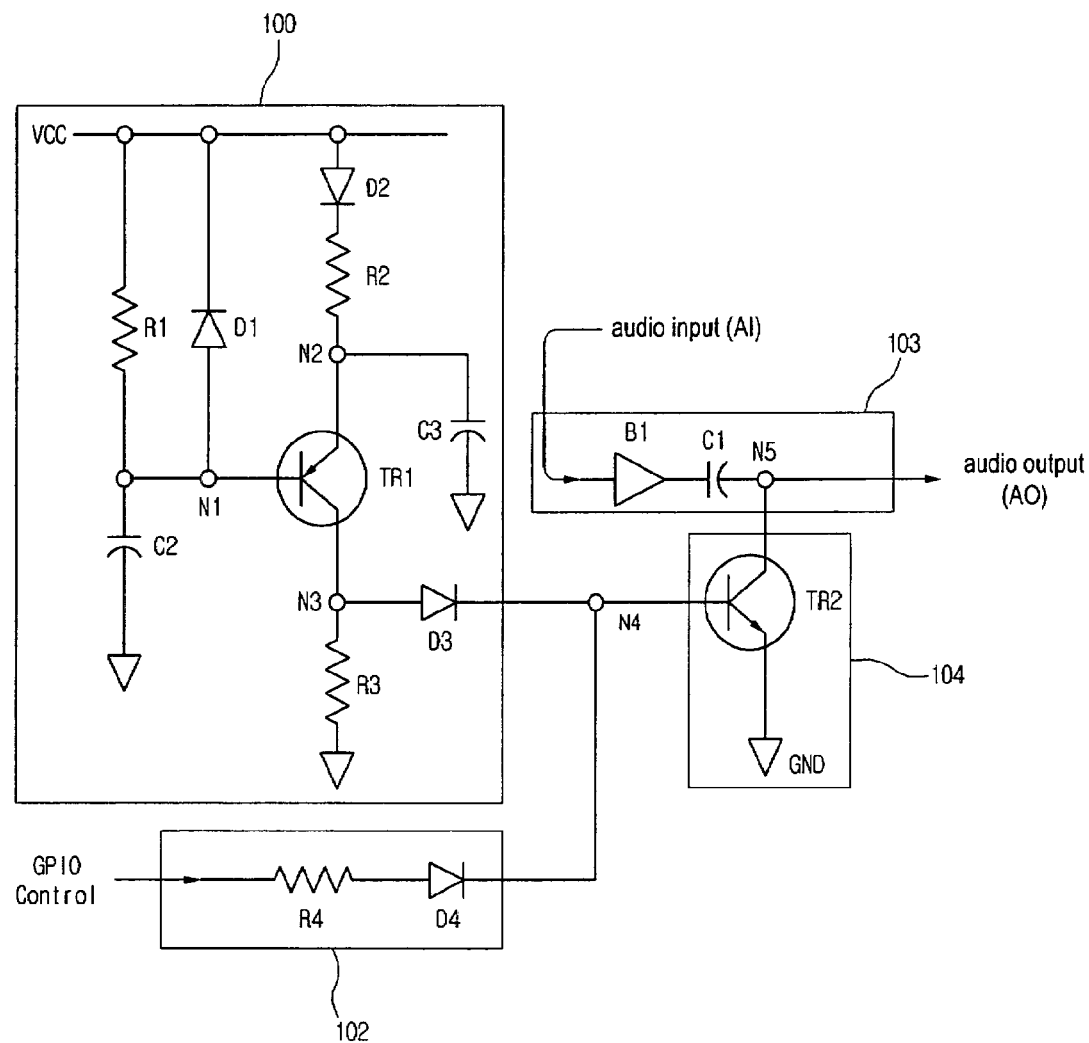
FIG. 1 illustrates the construction of a circuit for eliminating pop noises in conventional audio equipment.

Reference now should be made to the drawings, in which the same reference numerals are used throughout the different drawings to designate the same or similar components.

Preferred embodiments of an apparatus and method for eliminating pop noises according to the present invention are described in detail with reference to the accompanying drawings.

When playing conditions or a playing mode is changed by a user during the playing of audio, the level of the audio being played abruptly changes, so that a noise called a pop noise may be generated. For example, this is the case where the manipulation of skipping to a subsequent track (track skip), the manipulation of changing the file being played, or the manipulation of rapidly moving a playing position to another location on the same track (seek mode) is performed by the user while audio is played on a specific track.

Accordingly, the change of playing conditions, which may cause a pop noise, during the playing of audio can be detected, and the abrupt change of the level of the PCM data of the audio, that is, the pop noise, can be prevented.

FIG. 2 is a block diagram illustrating an apparatus for eliminating pop noises according to an embodiment of the present invention.

The pop noise elimination apparatus includes a control unit 208 for controlling the operation of the entire apparatus and predicting pop noises, a decoding unit 200 for preventing pop noises from being generated in the PCM data of audio using a prediction signal transmitted from the control unit 208, and a Digital-Analog Converter (DAC) 210 for converting pop noise-free PCM data, which is output from the decoding unit 200, into analog signals and outputting the analog signals.

The decoding unit 200 includes a first buffer 202 for storing the PCM data of audio being played, a data processing unit 204 for receiving a pop noise prediction signal from the control unit 208 and eliminating pop noises from the PCM data stored in the first buffer 202, and a second buffer 206 for storing and outputting pop noise-free PCM data output from the data processing unit 204.

The control unit 208 transmits a prediction signal providing notification of the generation of pop noises to the decoding unit 200 as the user changes playing conditions or selects a playing mode.

The decoding unit 200 receives a prediction signal from the control unit 208, eliminates pop noises from the PCM data using a predetermined method, and outputs pop noise-free PCM data.

The first buffer 202 of the decoding unit 200 stores the PCM data of input audio, and transmits the PCM data to the data processing unit 204. The data processing unit 204 eliminates pop noises by decreasing and/or increasing the PCM data stored in the first buffer 202 using a predetermined method based on the pop noise prediction signal transmitted from the control unit 208, and transmits pop noise-free PCM data to the second buffer 206. The second buffer 206 stores the pop noise-free PCM data transmitted from the data processing unit 204.

The DAC 210 converts the PCM data, which is stored in the second buffer 206, into analog signals, and outputs the analog signals.

The operation of the pop noise elimination apparatus according to the present invention, which is illustrated in FIG. 2, is described below.

When the user selects a certain playing mode during the playing of audio, the level of the PCM data of audio being played abruptly changes, therefore a pop noise may occur. The control unit 208 realizes the selected playing mode and, at the same time, transmits a prediction signal predicting the occurrence of a pop noise to the decoding unit 200 as the user selects the playing mode.

In this case, as the playing mode is selected, the level of neighboring data is abruptly changed, so that PCM data including the pop noise can be stored in the first buffer 202 of the decoding unit 200.

Furthermore, the data processing unit 204 eliminates the pop noise by dividing the PCM data including the pop noise, which is stored in the first buffer 202, by an exponential function and, thus, decreasing the level when receiving the prediction signal from the control unit 208, and transmitting pop noise-free PCM data to the second buffer 206.

The second buffer 206 stores the pop noise-free PCM data transmitted from the data processing unit 204, and the DAC 210 converts the PCM data, which is stored in the second buffer 206, into analog signals and outputs the analog signals.

In the meantime, if playing conditions or a playing mode has not been changed during the playing of audio, the decoding unit 200 stores the PCM data of input audio in the second buffer 206 without the operation for eliminating pop noises.

The PCM data of audio stored in the first buffer 202 of the decoding unit 200 is processed by the data processing unit 204 using a predetermined method, and is transmitted to the second buffer 206.

FIG. 3 illustrates an embodiment of the present invention in which the PCM data of audio is differently processed according to the selected playing mode so as to eliminate pop noises.

As illustrated in FIG. 3, in the case where a track skip mode or file change mode, which corresponds to a file skip mode, is selected by the user during the playing of a certain audio file (see (a)), the data processing unit 204 eliminates a pop noise (a1) attributable to the level difference of the PCM data by dividing the PCM data by, for example, the exponential function of 2 and, thus, making the level approach 0 (see (a2)), and performing playing while gradually increasing the level of the PCM data, which has been made to approach 0, when detecting the start bit of a new audio file stream.

Meanwhile, in the case where a seek mode, which rapidly moves a playing position to another location on the same track, is selected by the user during the playing of a certain track of the audio (see (b)), the data processing unit 204 makes the level of the PCM data approach 0 by dividing the PCM data by, for example, an exponential function of 4 so as to eliminate a pop noise (b1) attributable to the level difference of the PCM data, and gradually increases the level of the PCM data by multiplying the PCM data by an exponential function of 4 when the user terminates the seek mode (see (b2)).

Figure 4:
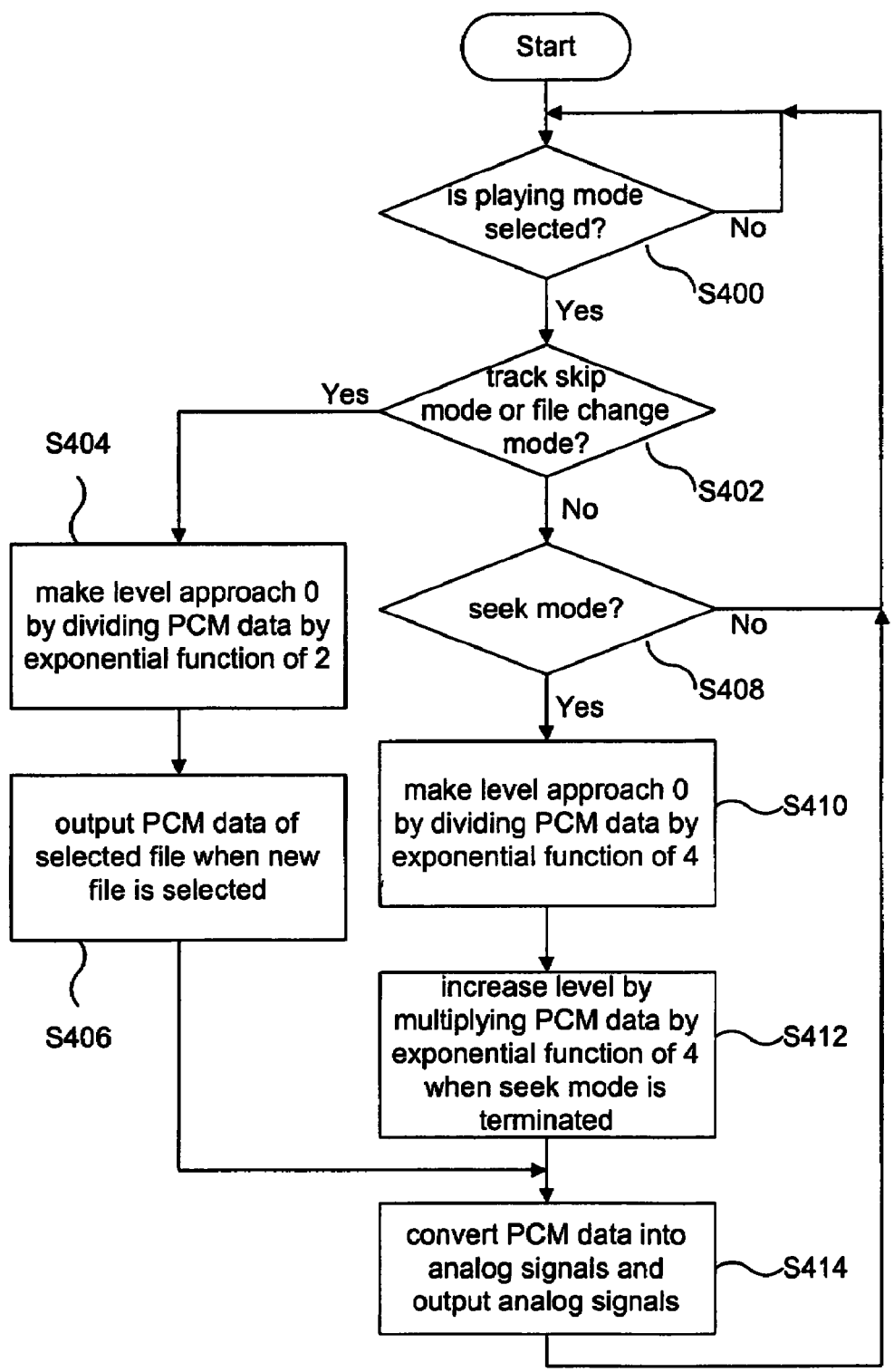
FIG. 4 is a flowchart illustrating the operation of a method of eliminating pop noises according to an embodiment of the present invention.

FIG. 4 is a flowchart illustrating the operation of a method of eliminating pop noises according to an embodiment of the present invention.

If the user has selected a certain playing mode at step S400, the control unit 208 determines whether the selected playing mode is a track skip mode or file change mode at step S402.

If the playing mode selected by the user is a track skip mode or file change mode at step S402, the control unit 208 transmits a prediction signal, indicating that pop noises would be generated due to the track skip mode or file change mode, to the data processing unit 204, and the data processing unit 204 makes the PCM data approach 0 by dividing the PCM data of audio including the pop noises, which is stored in the first buffer 202, by an exponential function of 2 at step S404.

The data processing unit 204 detects a start bit included in the frame of a new audio file, gradually increases the level of the PCM data made to approach 0, and outputs normal PCM data at step S406.

Furthermore, if the playing mode selected by the user at step 402 is not a track skip mode or file change mode, the control unit 208 determines whether the playing mode selected by the user is a seek mode at step S408.

If the playing mode selected by the user is a seek mode, the control unit 208 transmits a prediction signal, indicating that pop noises would be generated due to the seek mode, to the data processing unit 204.

The data processing unit 204 receives a pop noise prediction signal according to the seek mode from the control unit 208, and makes the PCM data of the audio, including the pop noises, which has been stored in the first buffer 202, approach 0 by dividing the PCM data by an exponential function of 4 at step S410.

The control unit 208 detects the termination of the seek mode by the user, and transmits information about the termination of the seek mode to the data processing unit 204. Accordingly, the data processing unit 204 performs output while increasing the level of the PCM data by multiplying the PCM data, which has been stored in the first buffer 202, by the exponential function of 4 at step S412.

The DAC 210 converts the PCM data, from which the pop noise has been eliminated at step S406 or S412 and stored in the second buffer 206, into analog signals, and outputs the analog signals at step S414.

The present invention may be applied to audio players, such as Compact Disc/Digital Versatile Disc (CD/DVD) players, Moving Picture Experts Group-1/2 Audio Layer-3 (MP3) players and Portable Multimedia Players (PMPs), that are capable of playing audio media, such as CDs and DVDs and/or audio files, such as MP3 files, Ogg files and WMA files.

According to the present invention, pop noise causing discomfort can be efficiently eliminated, and the problems with the prior art, that is, the large volume of a system and the repetition of high-speed switching, can be solved.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An audio processing method, comprising:
   receiving, via an input unit, a command indicating a playing mode is to be changed;
   determining, via a processor, whether the playing mode is a random skip track playing mode or a sequential skip track playing mode;
   processing, via the processor, audio data to be output after the playing mode is changed by a specific exponential function that reduces an abrupt change in a level of the audio data, when the determining step determines the playing mode is the random skip track playing mode or the sequential skip track playing mode;
   outputting, via an output unit, the audio data after processing of the audio data is completed; and
   dividing the audio data by the specific exponential function before a skip to another track is completed.

2. The audio processing method as set forth in claim 1, further comprising converting the processed audio data into analog signals and outputting the analog signals.

3. The audio processing method as set forth in claim 1, wherein the specific exponential function is an exponential function of 2.

4. The audio processing method as set forth in claim 1, wherein the audio data is multiplied by the specific exponential function after the change playing mode has been completed.

5. The audio processing method as set forth in claim 4, wherein the specific exponential function is an exponential function of 4.

6. The audio processing method as set forth in claim 1, wherein the specific exponential function is different for the random skip track playing mode than for the sequential skip track playing mode.

7. The audio processing method as set forth in claim 1, wherein the specific exponential function for the random skip track playing mode gradually decreases.

8. The audio processing method as set forth in claim 1, wherein the specific exponential function for the sequential skip track playing mode gradually decreases and then after the sequential track playing mode is terminated, the exponential function gradually increases.

9. An audio processing apparatus, comprising:
   an input unit configured to receive a command indicating a playing mode is to be changed;
   a processor configured to determine whether the playing mode is a random skip track playing mode or a sequential skip track playing mode, and to process audio data to be output after the playing mode is changed by a specific exponential function that reduces an abrupt change in a level of the audio, when the playing mode is determined to be the random skip track playing mode or the sequential skip track playing mode; and
   an output unit configured to output the audio data after processing of the audio data is completed,
   wherein the processor is further configured to divide the audio data by the specific exponential function before a skip to another track is completed.

10. The audio processing apparatus as set forth in claim 9, wherein the processor is further configured to convert the processed audio data into analog signals and to output the analog signals.

11. The audio processing apparatus as set forth in claim 9, wherein the specific exponential function is an exponential function of 2.

12. The audio processing apparatus as set forth in claim 9, wherein the processor is further configured to multiply the audio data by the specific exponential function after the playing mode has been completed.

13. The audio processing apparatus as set forth in claim 12, wherein the specific exponential function is an exponential function of 4.

14. The audio processing apparatus as set forth in claim 9, wherein the specific exponential function is different for the random skip track playing mode than for the sequential skip track playing mode.

15. The audio processing apparatus as set forth in claim 9, wherein the specific exponential function for the random skip track playing mode gradually decreases.

16. The audio processing apparatus as set forth in claim 9, wherein the specific exponential function for the sequential skip track playing mode gradually decreases and then after the sequential track playing mode is terminated, the exponential function gradually increases.

17. An audio processing method, comprising:
   determining, via a processor, whether a playing mode that abruptly changes a level of audio data being played has been input; and
   processing, via the processor, the audio data so as to mitigate the abrupt change in the level of the audio data if the playing mode has been input,
   wherein the playing mode is one of a playing mode that causes a jump from a current track of the audio data being played to another track,
   wherein the audio data is divided by a specific exponential function before the jump to the another track is completed, and
   wherein the exponential function is an exponential function of 2.

18. An audio processing apparatus, comprising:
   a signal processing unit configured to perform signal processing on audio data;
   a Digital-Analog Converter (DAC) configured to convert the processed audio data into analog signals and to output the analog signals; and
   a control unit configured to determine whether a playing mode that abruptly changes a level of the audio data being played has been input, and to control the signal processing unit so as to mitigate the abrupt change in the level of the audio data if the playing mode has been input,
   wherein the playing mode is a track skip mode or an audio file change mode that causes a jump from a current track of the audio data being played to another track,
   wherein the signal processing unit is further configured to divide the audio data by a specific exponential function before the jump to the another track is completed, and
   wherein the exponential function is an exponential function of 2.

* * * * *